(12) United States Patent
Liu et al.

(10) Patent No.: US 9,143,870 B2
(45) Date of Patent: Sep. 22, 2015

(54) MICROPHONE SYSTEM WITH MECHANICALLY-COUPLED DIAPHRAGMS

(71) Applicant: Invensense, Inc., San Jose, CA (US)

(72) Inventors: Fang Liu, Woburn, MA (US); Kuang L. Yang, Newton, MA (US)

(73) Assignee: INVENSENSE, INC., San Jose, CA (US)

( * ) Notice: Subject to any disclaimer, the term of this patent is extended or adjusted under 35 U.S.C. 154(b) by 302 days.

(21) Appl. No.: 13/673,324

(22) Filed: Nov. 9, 2012

(65) Prior Publication Data

US 2014/0133685 A1   May 15, 2014

(51) Int. Cl.
| | |
|---|---|
| *H04R 1/04* | (2006.01) |
| *H04R 19/04* | (2006.01) |
| *H04R 7/20* | (2006.01) |
| *H04R 3/00* | (2006.01) |
| *H04R 31/00* | (2006.01) |
| *B81B 3/00* | (2006.01) |
| *H04R 19/00* | (2006.01) |
| *H04R 1/28* | (2006.01) |
| *H04R 7/06* | (2006.01) |

(52) U.S. Cl.
CPC .............. *H04R 19/04* (2013.01); *B81B 3/0056* (2013.01); *H04R 3/005* (2013.01); *H04R 7/20* (2013.01); *H04R 31/006* (2013.01); *B81B 2201/0221* (2013.01); *B81B 2201/0257* (2013.01); *H04R 1/2807* (2013.01); *H04R 7/06* (2013.01); *H04R 19/005* (2013.01)

(58) Field of Classification Search
CPC ................. H04R 19/04; H04R 19/005; H04R 2201/003; H04R 7/20; H04R 7/122; H04R 1/083; H04R 31/006; H04R 3/005; H04R 7/06; H04R 1/2807; B81B 3/0056; B81B 2201/0257; B81B 2201/0221
USPC ........... 381/26, 184, 186, 335, 398, 423, 355, 381/369
See application file for complete search history.

(56) References Cited

U.S. PATENT DOCUMENTS

| | | | |
|---|---|---|---|
| 3,612,778 A | 10/1971 | Murphy ........................... | 179/11 |
| 4,327,257 A | 4/1982 | Schwartz ............. | 179/115.5 ES |
| 5,003,606 A | 3/1991 | Bordewijk .................... | 381/68.4 |
| 6,088,463 A | 7/2000 | Rombach et al. ............. | 381/174 |
| 7,146,014 B2 * | 12/2006 | Hannah ........................... | 381/92 |
| 8,045,733 B2 * | 10/2011 | Zhe et al. ....................... | 381/174 |

(Continued)

OTHER PUBLICATIONS

Banser, Jr., Frederic A. "Micromachined Biomimetic Optical Microphones with Improved Packaging and Power Consumption," *George W. Woodruff School of Mechanical Engineering*, Georgia Institute of Technology, 135 pages, May 2012.

(Continued)

*Primary Examiner* — Davetta W Goins
*Assistant Examiner* — Oyesola C Ojo
(74) *Attorney, Agent, or Firm* — Maryam Imam; IPxLaw Group LLP

(57) ABSTRACT

A microphone system has two diaphragms and are mechanically interconnected such that they respond in antiphase to an acoustic signal impinging on one of the diaphragms. The two diaphragms produce two variable capacitances that vary proportionately but inversely to one another. Voltage signals produced by the two variable capacitances are summed to provide an output signal proportional to the acoustic signal, but with greater sensitivity than a single-diaphragm microphone.

23 Claims, 13 Drawing Sheets

(56) References Cited

U.S. PATENT DOCUMENTS

| | | | |
|---|---|---|---|
| 8,126,167 B2* | 2/2012 | Hirade et al. | 381/174 |
| 8,345,898 B2* | 1/2013 | Reining | 381/184 |
| 2003/0133588 A1 | 7/2003 | Pedersen | 381/423 |
| 2011/0198714 A1* | 8/2011 | Yang | 257/416 |

OTHER PUBLICATIONS

Baris Bicen "Micromachined Diffraction Based Optical Microphones and Intensity Probes with Electrostatic Force Feedback," *George Institute of Technology*, 184 pages, Aug. 2010.

Liu, J., et al. "Harmonic Balance Nonlinear Identification of a Capacitive Dual-Backplate MEMS Microphone," *Journal of Microelectromechanical Systems*, vol. 17, No. 3, Jun. 2008, pp. 698-708.

Martin, D., et al. "Development of a MEMS Dual Backplate Capacitive Microphone for Aeroacoustic Measurements," *American Institute of Aeronautics and Astronautics*, 44th AIAA Aerospace Sciences Meeting and Exhibit, AIAA Paper 2006-1246, pp. 1-14.

Martin, D., et al. "A Micromachined Dual-Backplate Capacitive Microphone for Aeroacoustic Measurements," *Journal of Microelectromechanical Systems*, vol. 16, No. 6, Dec. 2007, pp. 1289-1302.

Martin, David "Compliant Membranes for the Development of a MEMS Dual-Backplate Capacitive Microphone Using the SUMMiT V Fabrication Process," Sandia Report, Sandia National Laboratories; Printed Nov. 2005, 19 pages.

Miles, R.N., et al. "A Low-Noise Differential Microphone Inspired by the Ears of the Parasitoid Fly *Ormia ochracea*," *J. Acoust. Soc. Am.*, 125 (4), pp. 2013-2026, Apr. 2009.

Rombach, P., et al. "The First Low Voltage, Low Noise Differential Silicon Microphone, Technology Development and Measurement Results," *Sensors and Actuators*, 95, pp. 196-201, 2002.

Schestok, Jennifer "Inspired by a Fly," *Business Branding—Stay Ahead of the Game, Advance for Audiologists*, pp. 43-46, May/Jun. 2004.

Tajima, T., et al. "High-Performance Ultra-Small Single Crystalline Silicon Microphone of an Integrated Structure," *Microelectronic Engineering*, pp. 508-519, 2003.

Cui, et al. Optical Sensing in a Directional MEMS Microphone Inspired by the Ears of the Parasitoid Fly, *Ormia ochracea, IEEE*, MEMS 2006, Istanbul, Turkey 22-26, Jan. 2006, pp. 614-617.

* cited by examiner

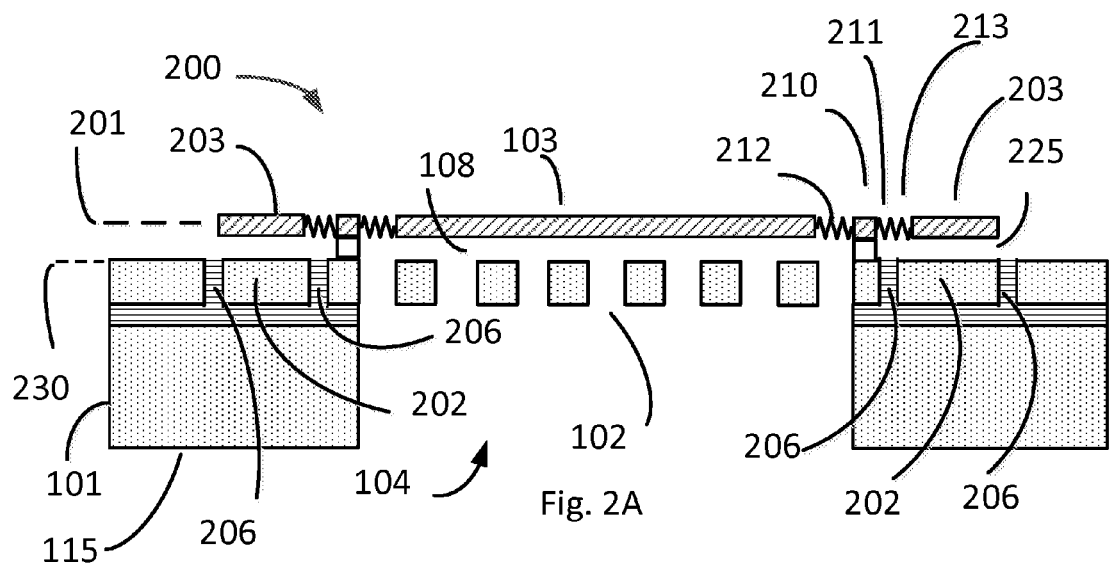
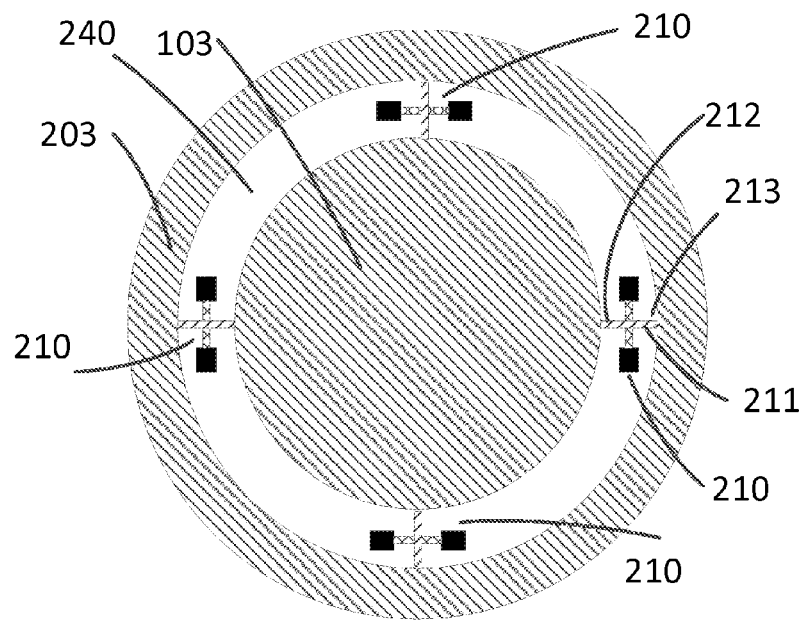
Fig. 2A
Fig. 2D

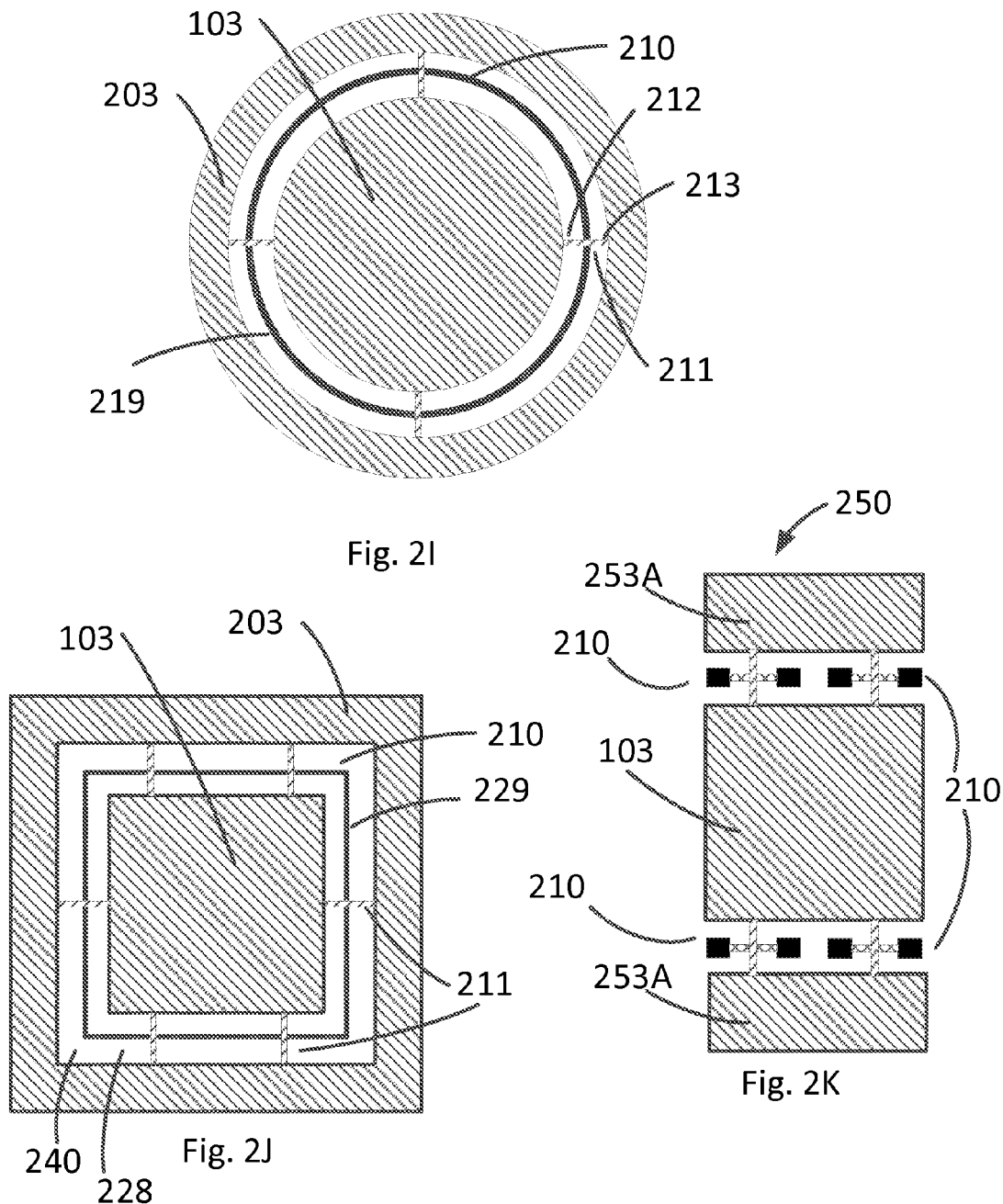

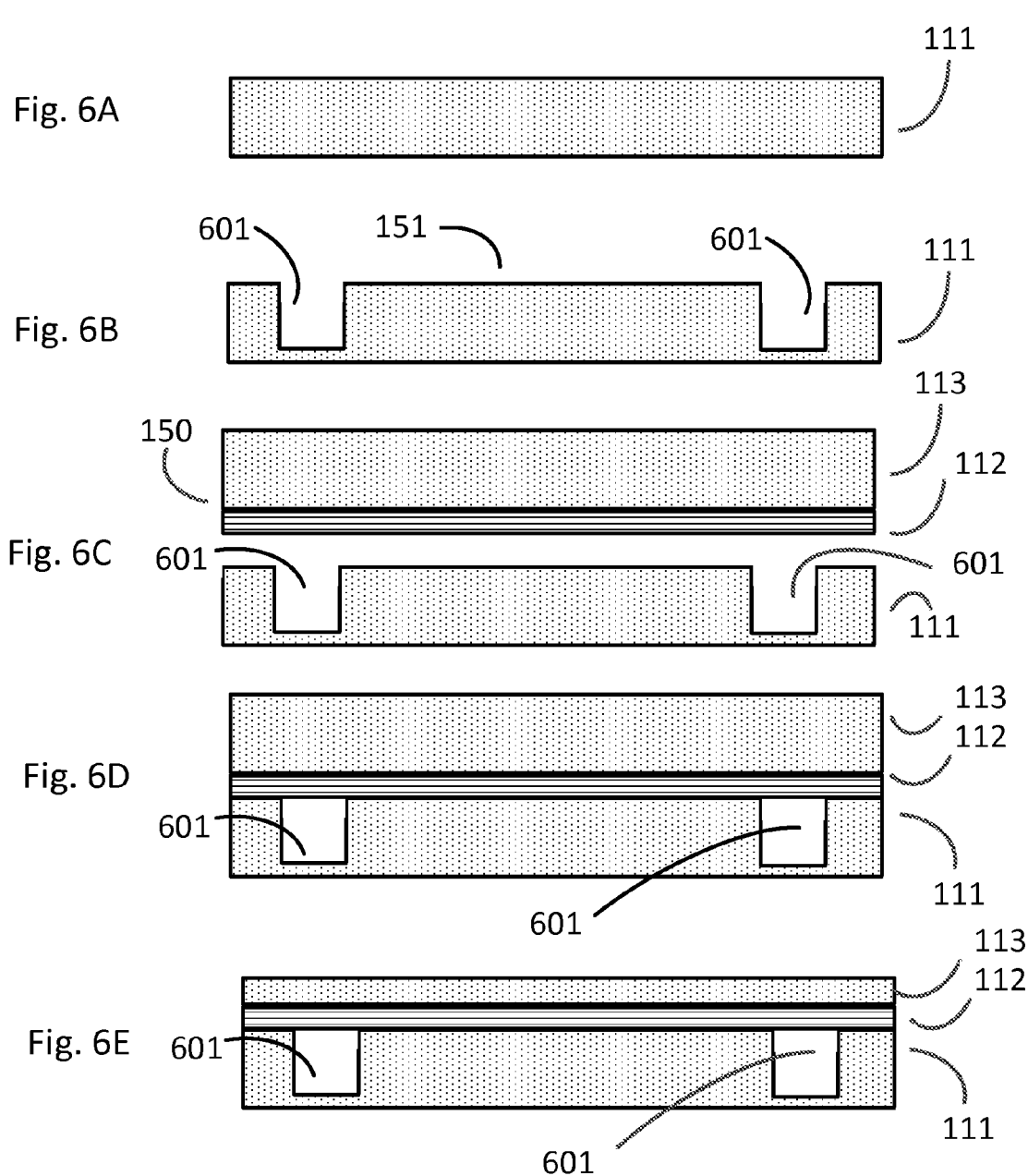

MICROPHONE SYSTEM WITH MECHANICALLY-COUPLED DIAPHRAGMS

TECHNICAL FIELD

The present invention relates to microphones, and more particularly to micro-electro-mechanical ("MEMS") microphones.

BACKGROUND ART

Micro-electromechanical ("MEMS") components and processes are used for a wide variety of different devices. For example, among other things, they are commonly used for producing accelerometers to detect acceleration, pressure sensors to detect pressure, power scavengers to accumulate power, and as microphones to capture acoustic signals.

MEMS capacitive microphones in particular have found a wide variety of different uses, such as in consumer electronics (e.g., cameras), smart phones and personal computers. This wide use is due in part to their higher stability and smaller size than traditional condenser microphones. As the technology improves, there is an increasing demand to enhance acoustic quality—in particular, higher sensitivity. In general, the dynamic range of a microphone is limited at the upper end by total harmonic distortion and at the lower end by its noise floor.

SUMMARY OF VARIOUS EMBODIMENTS

In a first embodiment of the invention, a microphone system for detecting an acoustic signal includes a micromachined device having a backplate; a primary diaphragm separated from the backplate by a variable primary gap; the primary diaphragm and the backplate forming a variable primary capacitance across the primary gap, such that the primary capacitance varies in response to the acoustic signal impinging on the primary diaphragm; a reference electrode; a reference diaphragm separated from the reference electrode by a variable reference gap, the reference diaphragm forming a variable reference capacitance with the reference electrode across the variable reference gap; and a mechanical coupler coupling the primary diaphragm to the reference diaphragm. The mechanical coupler is configured to vary the reference gap inversely and proportionately to the variation of primary gap, and to vary the reference capacitance inversely and proportionately to the reference capacitance.

In some embodiments, the mechanical coupler includes a torsion bar supported by at least one anchor coupled to a substrate, the torsion bar between the primary diaphragm and the reference diaphragm; and a beam coupled to the torsion bar, the primary diaphragm, and the reference diaphragm, the beam mechanically coupling the primary diaphragm to the reference diaphragm.

In some embodiments, the primary capacitance is about equal to the reference capacitance when the microphone is not subject to an acoustic signal.

In some embodiments, the primary diaphragm defines a diaphragm plane when not subject to an acoustic signal, and wherein the reference diaphragm is nominally within the diaphragm plane, and is radially spaced from the primary diaphragm.

In some embodiments, the primary diaphragm and the reference diaphragm define an electrical node. Indeed, in some embodiments, the primary diaphragm, the mechanical coupler, and the reference diaphragm define an electrical node.

Some embodiments also include a substrate having a frontside and a backside, and the substrate includes a backside cavity extending into the backside of the substrate, and the primary diaphragm suspended from the frontside and exposed through the backside cavity.

In some embodiments, the system further includes a differential circuit having a non-inverting input and an inverting input, the primary capacitance electrically coupled to the non-inverting input and the reference capacitance coupled to the inverting input. Indeed, in some embodiments the differential circuit is a differential amplifier. In some embodiments, the primary diaphragm is suspended parallel to the backplate, and in some embodiments the reference diaphragm is suspended parallel to the reference electrode.

In some embodiments, the primary capacitance has a nominal primary capacitance value, and the reference capacitance has a nominal reference capacitance value equal to the primary capacitance value. Further, in some embodiments the primary capacitance has a nominal primary capacitance value, and the reference capacitance has a nominal reference capacitance value, and the reference capacitance has a nominal reference capacitance value equal to the primary capacitance value.

In some embodiments, the microphone has a substrate that includes the backplate and the reference diaphragm. Further, in some embodiments the substrate includes a trough opposite the reference diaphragm.

In some embodiments, the primary diaphragm defines a diaphragm plane, and the reference diaphragm has an annular geometry and surrounds the primary diaphragm within the diaphragm plane. Indeed, in some embodiments the reference diaphragm and the primary diaphragm are concentric.

In another embodiment, a packaged microphone system for detecting an acoustic signal includes a housing with a base; a lid coupled to the base and covering the aperture to form a cavity, one of the base and the lid forming an aperture extending from the cavity to the environment outside of the housing; and also includes a MEMS microphone secured within the cavity and being in acoustic communication with the aperture, the MEMS microphone forming a backside cavity, and being coupled to the base such that the backside cavity covers the aperture; a backplate supported by the substrate, a primary diaphragm suspended from the substrate and forming a variable primary capacitance with a backplate; a reference diaphragm suspended from the substrate and laterally spaced from the primary diaphragm, the reference diaphragm forming a variable reference capacitance with the reference electrode; a mechanical coupler coupling the primary diaphragm to the reference diaphragm, the reference diaphragm being configured to move in antiphase to the primary diaphragm when an acoustic signal impinges on the primary diaphragm.

In some embodiments, the reference diaphragm is not directly exposed to the aperture such that there is no direct acoustic path from the base aperture to the reference diaphragm.

In some embodiments, the primary diaphragm and the reference diaphragm are concentric.

In another embodiment, a microphone system for detecting an acoustic signal includes a micromachined device having a backplate; a primary diaphragm suspended parallel to the backplate and separated from the backplate by a variable primary gap to form a variable primary capacitance across the primary gap, the primary capacitance varying in response to the acoustic signal impinging on the primary diaphragm; a reference electrode; a reference diaphragm suspended parallel to the reference electrode and separated from the reference electrode by a variable reference gap to form a variable reference capacitance with the reference electrode across the variable reference gap; and means for mechanically coupling the primary diaphragm to the reference diaphragm, the mechanically coupling means being configured to vary the reference gap inversely and proportionately to the primary gap in response to impingement of the acoustic signal on the primary diaphragm such that the reference capacitance varies inversely and proportionately to the primary capacitance.

In some embodiments, the means for mechanically coupling includes means for supporting a torsion bar from a substrate, the torsion bar between the primary diaphragm and the reference diaphragm; and a beam coupled to the torsion bar, the primary diaphragm, and the reference diaphragm, wherein the beam mechanically couples the primary diaphragm to the reference diaphragm.

In some embodiments the system further includes a circuit for producing an output signal in response to changes in the primary capacitance and the reference capacitance.

BRIEF DESCRIPTION OF THE DRAWINGS

The foregoing features of embodiments will be more readily understood by reference to the following detailed description, taken with reference to the accompanying drawings, in which:

FIGS. 2A-2K schematically illustrate embodiments of a MEMS microphone with mechanically-coupled diaphragms, and various features of such microphones;

FIGS. 6A-6E schematically illustrate features of an embodiment of a substrate for a MEMS microphone at various stages of fabrication;

DETAILED DESCRIPTION OF SPECIFIC EMBODIMENTS

In various embodiments, a microphone system produces an output signal with sensitivity greater than many known MEMS microphones, while maintaining a comparable height profile—in some embodiments, they have the same height profile. To that end, exemplary embodiments have mechanically-coupled primary and reference diaphragms that move inversely to one another (i.e., when one moves up, the other moves down) to significantly increase the signal. In fact, illustrative embodiments often produce more electrical signal from an acoustic signal impinging on primary diaphragm than a prior art microphone having a like sized single diaphragm. Details of illustrative embodiments are discussed below.

Figure 1A:
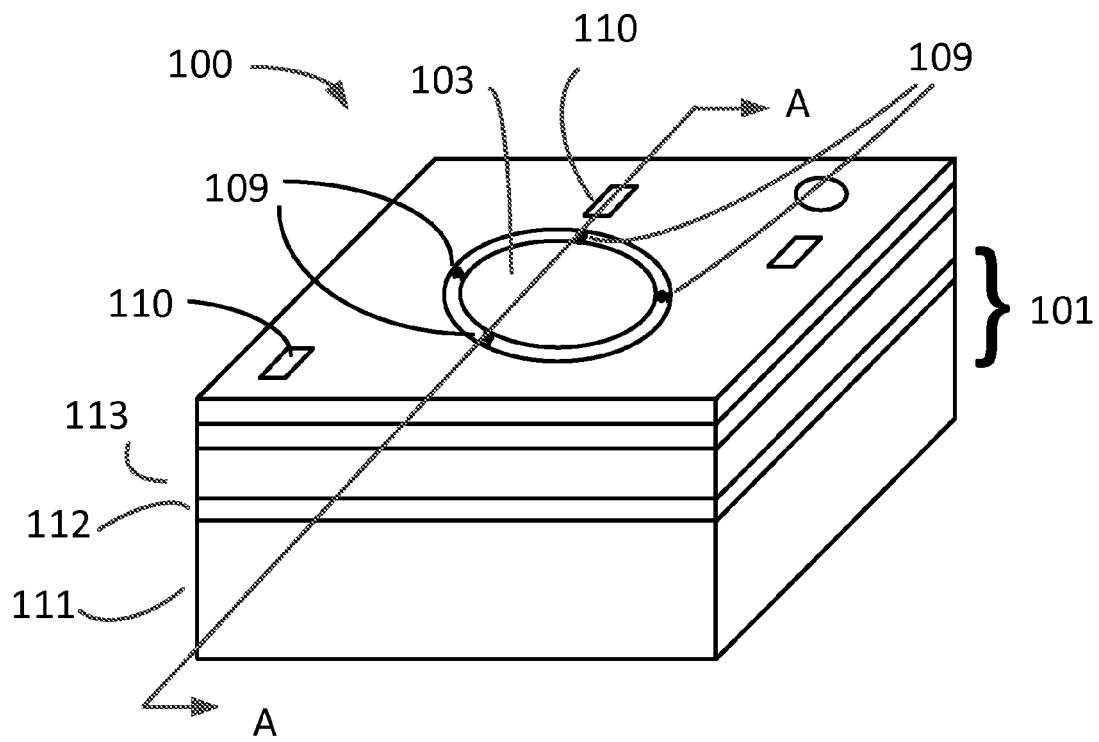
FIGS. 1A and 1B schematically illustrate a MEMS microphone.
Figure 1B:
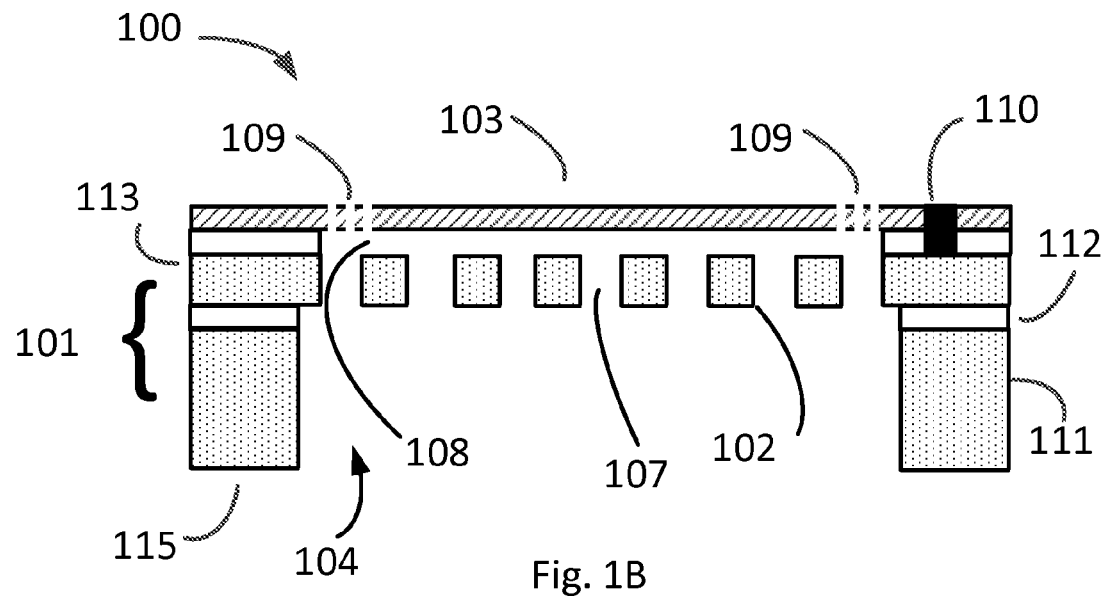

FIG. 1A schematically illustrates a top, perspective view of a MEMS microphone chip 100. FIG. 1B schematically shows a cross-sectional view of the same MEMS microphone chip 100 along section A-A. These two figures are discussed to detail some exemplary components of a MEMS microphone.

As shown in FIGS. 1A and 1B, the microphone chip 100 has the chip base/substrate 101, one portion of which supports a backplate 102. The microphone 100 also includes a flexible diaphragm 103 that is movable relative to the backplate 102. The diaphragm 103 is suspended by springs 109, and the backplate 102 and diaphragm 103 are separated by a gap 108, and together form a variable capacitor across gap 108. In some microphones, the backplate 102 is formed from single crystal silicon (e.g., a part of a silicon-on-insulator, or "SOI," wafer, which may be known as the "device layer" 113), while the diaphragm 103 is formed from deposited polysilicon. In other embodiments, however, the backplate 102 and diaphragm 103 may be formed from different materials.

In the embodiment shown in FIG. 1B, the microphone substrate 101 includes the backplate 102 and other structures, such as a bottom wafer 111 and a buried oxide layer 112 of an SOI wafer. A portion of the substrate 101 also forms a backside cavity 104 extending from the bottom 115 of the substrate 101 to the bottom of the backplate 102. To facilitate operation, the backplate 102 has a plurality of through-holes 107 that lead from gap 108 (i.e., a gap between the diaphragm 103 and backplate 102) to the backside cavity 104. As such, the diaphragm 103 is exposed through the backside cavity 104. One or more terminals 110 may electrically couple features of the microphone, such as diaphragm 103 or backplate 102, for example, to circuitry on the MEMS device, or external circuitry.

It should be noted that various embodiments are sometimes described herein using words of orientation such as "top," "bottom," or "side." These and similar terms are merely employed for convenience and typically refer to the perspective of the drawings. For example, the substrate 101 is below the diaphragm 103 from the perspective of FIGS. 1A and 1B. However, the substrate 101 may be in some other orientation relative to the diaphragm 103 depending on the orientation of the MEMS microphone 100. Thus, in the present discussion, perspective is based on the orientation of the drawings of the MEMS microphone 100.

In operation, acoustic signals strike the diaphragm 103, causing it to vibrate, thus varying the gap 108 between the diaphragm 103 and the backplate 102 to produce a changing capacitance. The diaphragm may generally move in a plunger-like motion, in which the diaphragm 103 remains parallel to the backplate 102 as it moves towards, or recedes from, the backplate 102.

Unlike the microphone 100 described above shown in FIGS. 1A and 1B, illustrative embodiments have at least two diaphragms. Specifically, as shown in FIG. 2A and others, such a microphone system 200 includes two diaphragms: a first diaphragm 103 (which may be known as the "primary" diaphragm) and a second diaphragm 203 (which may be known as the "reference" diaphragm), both of which are suspended above the substrate 101. In some embodiments, the primary diaphragm 103 is acoustically open to the air and acoustic energy traveling from the backside 115 of the substrate 101 through the cavity 104 and the backplate 102, while the reference diaphragm 203 is isolated from the air and acoustic energy traveling from the backside 115 of the substrate 101 by layers of the substrate 101 under it.

When the microphone 200 is not subject to an impinging acoustic signal, the diaphragms 103 and 203 are nominally in the same plane (the plane, which may be known as the "nominal plane" or the "diaphragm plane," is schematically illustrated in profile by line 201). As schematically illustrated in FIG. 2A, microphone 200 is thinner than a dual-backplate microphone which would have a second backplate above the diaphragm, such that the diaphragm 103 would be sandwiched between backplate 102 and the second backplate.

Figure 10:
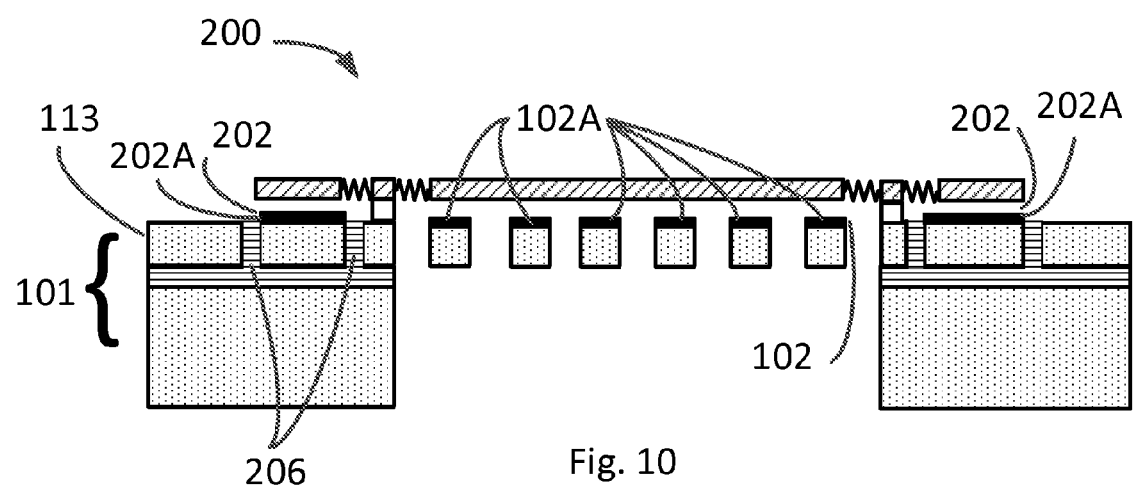
FIG. 10 schematically illustrates an alternate embodiment of a microphone with conductive electrodes.

As with the microphone 100 shown in FIGS. 1A and 1B, the primary diaphragm 103 forms a variable capacitance (which may be known as the "variable primary capacitance") with the backplate (or "backplate electrode") 102 across the gap 108. To this end, the backplate 102 may include doped polysilicon, for example, although in other embodiments the backplate 102 may include a conductive member (e.g., as schematically illustrated in FIG. 10).

When the microphone 200 is not subject to an impinging acoustic signal, the primary diaphragm 103 may be said to form a "nominal" primary capacitance with the backplate 102. That capacitance is a function, in part, of the surface area of the primary diaphragm 103, the surface area of the backplate 102, and the distance or gap 108 between them, according to the capacitance equation: $C=(\epsilon r)(\epsilon o)(A/d)$, where "C" is the capacitance, "$\epsilon r$" is the relative static permittivity, "$\epsilon o$" is the electric constant, "A" is the surface area of the overlap of the areas of the primary diaphragm and the backplate, and "d" is the distance by which the primary diaphragm 103 and the backplate 102 are separated. Among other things, this equation shows that the capacitance between the primary diaphragm 103 and the backplate 102 increases linearly as the distance between them decreases, if all other factors remain the same.

In a similar manner, the reference diaphragm 203 forms a variable reference capacitance with a reference electrode 202, in or on the substrate 101, across a gap 225. To this end, the reference electrode 202 may include doped polysilicon, for example, although in other embodiments the reference electrode 202 may include a conductive member (e.g., as schematically illustrated in FIG. 10).

The reference electrode 202 is electrically isolated from the rest of the substrate 101 by insulative buffer vias 206. In some embodiments, the buffer vias 206 may be oxide, for example, and may be contiguous with the buried oxide layer 112. In some embodiments, the buffer vias 206 have an annular shape, such that the reference electrode 202 surrounds one buffer via 206 and another buffer via 206 surrounds the reference electrode 202. In other embodiments, each of the vias 206 may be just an air-filled trench.

When the microphone 200 is not subject to an impinging acoustic signal, the reference diaphragm 203 may be said to form a "nominal reference capacitance" with the reference electrode 202. According to the capacitance equation above, the reference capacitance is a function, in part, of the gap 225 between the reference electrode 202 and the reference diaphragm 203.

In some embodiments, the surface area of the reference diaphragm 203 is equal to the surface area of the primary diaphragm 103, although in other embodiments the surface areas may be different. Similarly, in some embodiments the nominal reference capacitance is equal to the nominal primary capacitance, although in other embodiments to the capacitances may be difference.

One embodiment of the mechanically coupled primary diaphragm 103 and reference diaphragm 203 is schematically illustrated in FIG. 2D. In this embodiment, the primary diaphragm 103 is circular, and the reference diaphragm 203 is annular (i.e., has the shape of an annulus/toroid, in which the diaphragm 203 occupies the space between two concentric circles, and the inner circle defines a reference diaphragm aperture 240). In some embodiments in which an acoustic signal impinges on the primary diaphragm 103, the diaphragm aperture (e.g., 240) may serve to reduce or eliminate the amount of acoustic energy that would otherwise impinge on the reference diaphragm 203, for example by spacing the reference diaphragm 203 laterally from the primary diaphragm 103. In some embodiments, the primary diaphragm 103 is concentric with and in the same plane as, and yet laterally spaced from, the reference diaphragm 203. In some embodiments, the reference diaphragm 203 is a continuous ring, as schematically illustrated in FIG. 2D for example, but in other embodiments the reference diaphragm 203 may be segmented. The diaphragms 103 and 203 are not limited to circular or annular shapes, however. In other embodiments, one or both of the diaphragms may be non-circular, including square or rectangular shaped diaphragms, for example.

In some embodiments, the backplate 102 and reference electrode 202 are electrically independent of one another, such that the primary capacitance is separate from the reference capacitance. In some embodiments, the primary diaphragm 103 and the reference diaphragm 203 may be an electrical node, while the primary capacitance is separate from the reference capacitance. Indeed, in other embodiments, the primary diaphragm 103 and the reference diaphragm 203 and the mechanical coupler 210 may be an electrical node.

In illustrative embodiments, the primary diaphragm 103 and the reference diaphragm 203 may be electrically separate from one another, such that the primary capacitance is separate from the reference capacitance. Indeed, in some embodiments, the backplate 102 and reference electrode 202 may be an electrical node, while the primary capacitance is separate from the reference capacitance. However, the primary capacitance and reference capacitance may still have a relationship to one another, as described below.

When an acoustic signal impinges on the primary diaphragm 103, acoustic energy in the signal causes the primary diaphragm 103 to move, as described in connection with microphone 100. For example, in some embodiments, the primary diaphragm 103 remains parallel to the backplate 102 as it moves in response to acoustic energy.

However, that same acoustic energy—that is, the acoustic energy impinging on the primary diaphragm 103—also causes the motion of the reference diaphragm 203 relative to the substrate 101, or more particularly, relative to the reference electrode 202. Indeed, in some embodiments, the acoustic signal does not directly impinge on the reference diaphragm 203, so that the acoustic energy in the acoustic signal does not directly cause movement of the reference diaphragm 203. In some embodiments, acoustic energy from an acoustic signal impinging on one side of a primary diaphragm 103 may leak under the primary diaphragm 103, or around to the other side of the primary diaphragm 103, and thereby impinge on one side of the reference diaphragm 203. However, in some embodiments the effect of any such leakage is likely to be negligible.

The primary diaphragm 103 is mechanically coupled to the reference diaphragm 203 by one or more mechanical couplers 210. In illustrative embodiments, each mechanical coupler 210 includes a beam 211 suspended above the substrate 101, and coupled at one end 212 to the primary diaphragm 103, and at the other end 213 to the reference diaphragm 203. The beam 211 preferably will not bend along its length 215. However, in some embodiments the beam 211 may extend slightly along its length 215 (FIG. 2G) as the diaphragms 103, 203 move. In some embodiments, the beam 211 may be in the same layer as, and be made of the same material as, the primary diaphragm 103 and the reference diaphragm 203.

In some embodiments, the beam 211 is supported from the substrate 101. In some embodiments, the beam is supported at a point 216 between its two ends 212, 213, and in some embodiments may be support at the center point of its length 215.

The supporting structure 210 is coupled to the substrate 101 and is coupled to the beam 211 in such a way as to allow the beam 211 to rotate along an axis 220 normal to its length 215 and parallel to the plane 101. In FIG. 2A, the plane of the substrate is schematically illustrated in profile by line 230. As such, the beam 211 may be described as moving or pivoting similar to a teeter-totter (or seesaw), as schematically illustrated in FIG. 2H, for example.

Figure 2B:
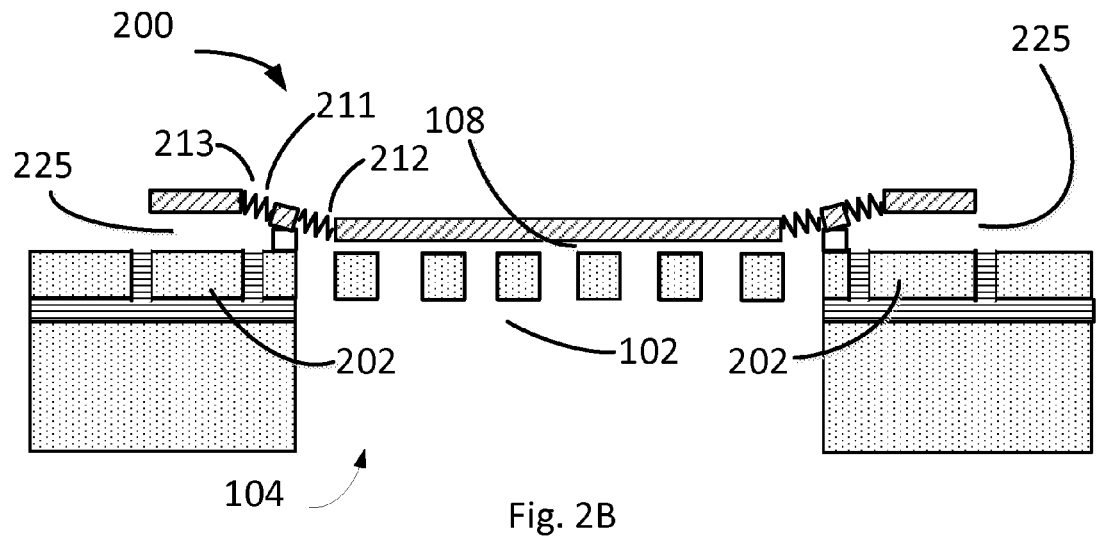
Figure 2C:
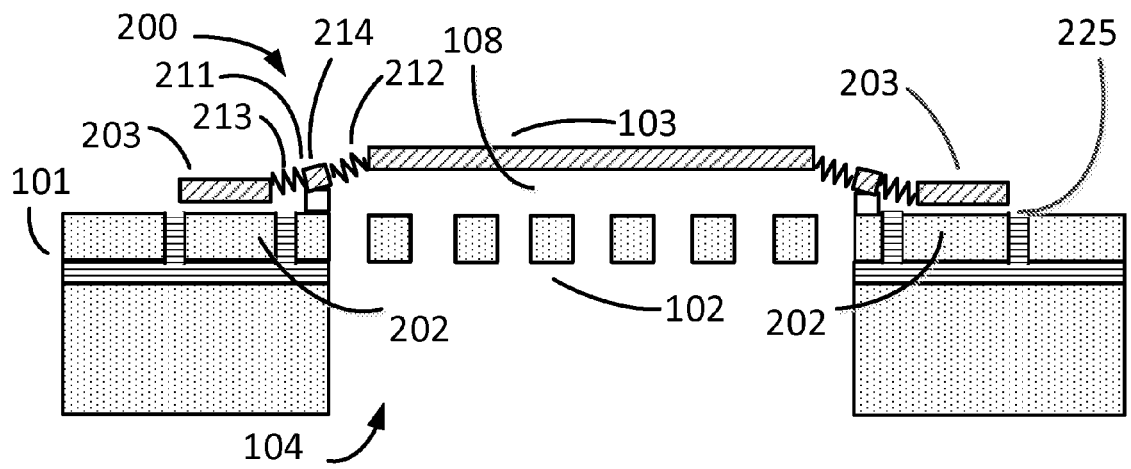
Figure 2E:
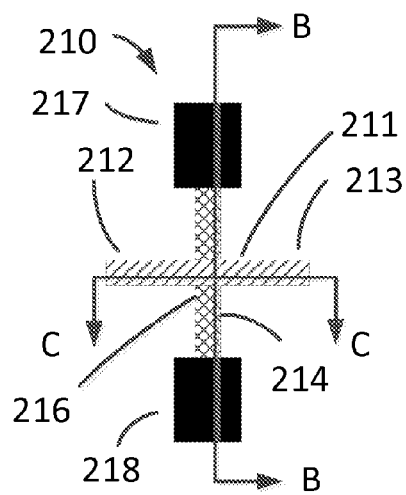
Figure 2F:
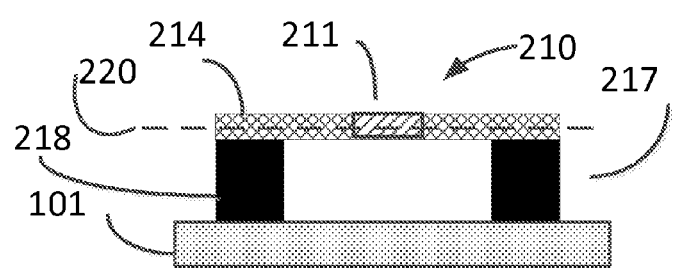
Figure 2G:
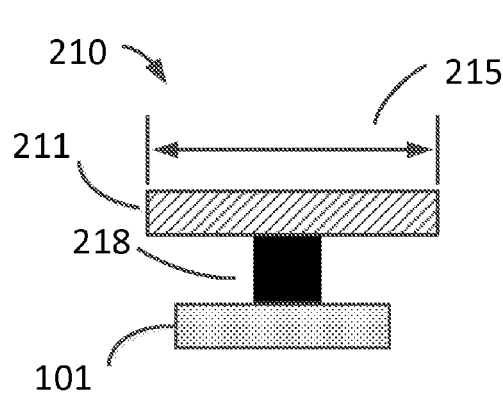
Figure 2H:
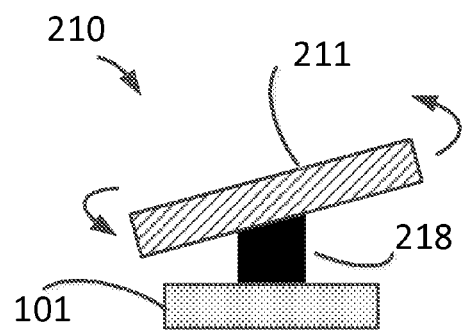

One embodiment of a mechanical coupler 210 is schematically illustrated in FIGS. 2E-2H, in which FIG. 2E schematically illustrates a plan view of mechanical coupler 210, FIG. 2F schematically illustrates a side view of mechanical coupler 210 along cross-section B-B, and FIGS. 2G and 2H schematically illustrate side views of mechanical coupler 210 along cross-section C-C (but also including anchor 218).

Mechanical coupler 210 includes two anchors 217, 218 coupled to the substrate 101. Anchors 217 and 218 support a torsion bar 214 above the substrate 101. The torsion bar 214 is flexible, and may twist along an axis 220 parallel to the substrate 101. For example, if one end 212 of beam 211 moves downwards toward the substrate 101, torsion bar 214 twists so that the other end 213 of the torsion bar moves upwards away from substrate 101, as schematically illustrated in FIG. 2H, for example.

An alternate embodiment of a mechanical coupler is schematically illustrated in FIG. 2I, and includes several beams 211 supported by a single, circular member 219. The circular ring member 219 may be in the same layer as the beams 211, and thus be supported above the substrate by a number of anchors (such as 217, 218), or may be supported by a single continuous anchor (e.g., 217) between the ring 219 and the substrate 101.

Although various embodiments are schematically illustrated has having four beams 211, other embodiments may have more or fewer beams, and one or more separate mechanical couplers. For example, some embodiments may have 2, 3 or even more mechanical couplers 210 placed between the primary diaphragm 103 and the reference diaphragm 203. In some embodiments with multiple mechanical couplers 210, the mechanical couplers 210 may be spaced evening around the primary diaphragm 103, as schematically illustrated in FIG. 2D for example, or spaced unevenly.

Alternate diaphragm embodiments are schematically illustrated in FIGS. 2J and 2K. In FIG. 2J, the primary diaphragm 103 has a square or rectangular geometry, and reference diaphragm 203 has a matching shape with an aperture 228 to accommodate the primary diaphragm 103, and a square or rectangular mechanical coupler 229 with several beams 211. Of course, one or more individual mechanical couplers 210 could be used in place of the single square mechanical coupler 229.

FIG. 2K schematically illustrates another embodiment, in which a primary diaphragm 103 is flanked by a two-part reference diaphragm 253. The primary diaphragm 103 is coupled to each segment 253A part of the reference diaphragm 253 by mechanical couplers 210. The microphone 250 also has a backplate (e.g., 102) beneath the diaphragm 103 to form a primary capacitance (e.g., 410), and a reference electrode (e.g., 202) in or on the substrate 101 and parallel to the reference diaphragm 253, so as to form a single variable reference capacitance (e.g., 420). In alternate embodiments, the primary diaphragm 103 may be flanked by only a single reference-diaphragm segment 253A adjacent to but not surrounding the primary diaphragm 103 (e.g., only one part 253A of the two-part reference diaphragm 253 in FIG. 2K). In yet other embodiments, the primary diaphragm 103 may be flanked by three or more reference diaphragm segments 253A, such as the reference diaphragm segments 253A in FIG. 2K for example.

In operation, when the primary diaphragm 103 moves in response to an impinging acoustic signal, the reference diaphragm 203 moves an equal amount, but in the opposite direction. For example, when the primary diaphragm 103 moves towards the substrate 101, the (proximal) end 212 of the beam 211 that is coupled to the primary diaphragm 103 also moves towards the substrate 101, as schematically illustrated in FIG. 2B. However, the other (distal) end of the beam 213 moves in the opposite direction—that is, away from the substrate 101. The distal end 213 of the beam 211 is connected to the reference diaphragm 203, and as such, the motion of the beam 211 moves or displaces the reference diaphragm 203, as schematically illustrated in FIG. 2B.

In some embodiments, the displacement of the primary diaphragm 103 by a given amount causes in equal displacement of the reference diaphragm in the opposite direction. For example, if an impinging acoustic signal causes the primary diaphragm 103 to move a distance X towards the backplate 102, then the reference diaphragm 203 moves a distance X away from the reference electrode 202, as schematically illustrated in FIG. 2B. Similarly, if an impinging acoustic signal causes the primary diaphragm 103 to move a distance X away from the backplate 102, then the reference diaphragm 203 moves an equal distance X towards the reference electrode 202, as schematically illustrated in FIG. 2C. As such, the primary diaphragm 103 and reference diaphragm 203 may be described as moving in antiphase, and in some embodiments, the motion of the primary diaphragm 103 and reference diaphragm move inversely and proportionately to one another. In some embodiments, the dimensions and construction of the diaphragms 103, 203, backplate 102 and the reference electrode 202 are configured such that the primary capacitance (e.g., 410) and reference capacitance (e.g., 420) vary inversely and proportionately to one another (e.g., if the primary capacitance 410 doubles, then the reference capacitance 420 is reduced by half).

In some embodiments, the primary diaphragm 103 moves such that it remains substantially parallel to the backplate 102, and the reference diaphragm 203 moves such that it remains substantially parallel to the reference electrode 202.

Similarly, when the primary diaphragm 103 moves away from the substrate 101, the end 212 of the beam 211 that is coupled to the primary diaphragm 103 also moves away from the substrate 101, as shown in FIG. 2C. However, the other (distal) end 213 of the beam 211 moves in the opposite direction—that is, towards the substrate 101. The distal end 213 of the beam 211 is connected to the reference diaphragm 203, and as such, the motion of the beam 211 moves the reference diaphragm 203 towards the substrate 101. As described above, in some embodiments, the reference diaphragm 103 moves such that it remains substantially parallel to the backplate 102, and the reference diaphragm 203 moves such that it remains substantially parallel to the reference electrode 202.

Figure 4A:
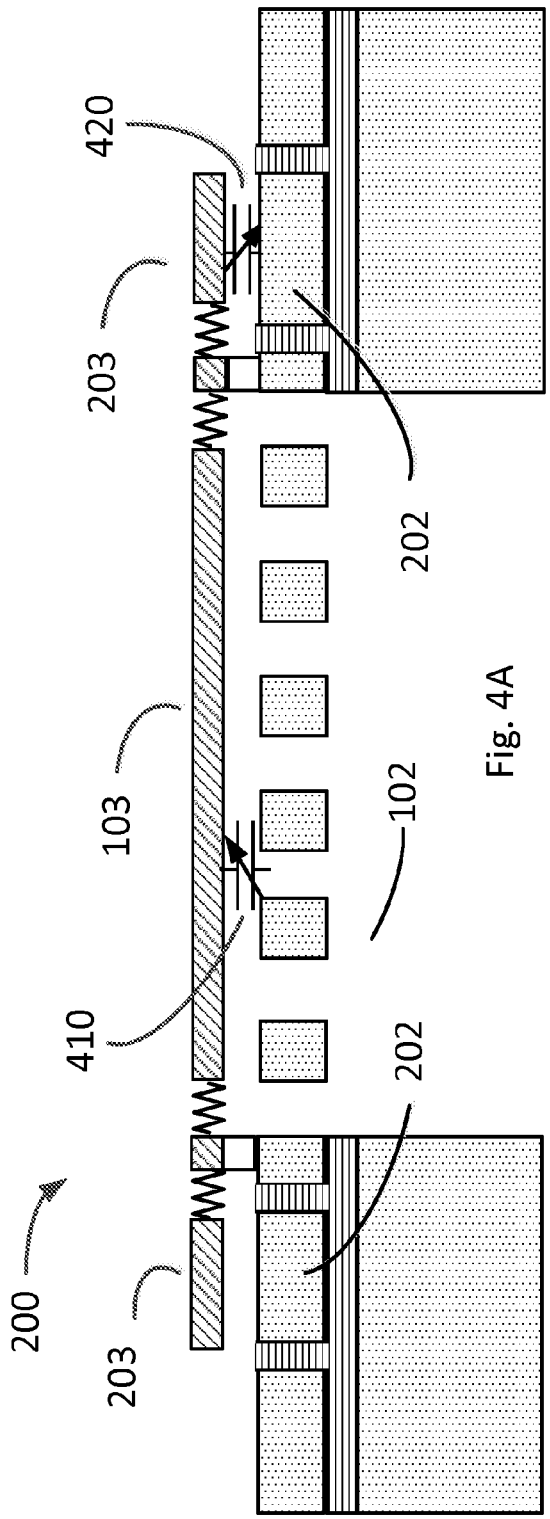
FIG. 4A schematically illustrates inversely variable capacitances of an embodiment of a MEMS microphone.

The variable primary capacitance 410 and variable reference capacitance 420, which are schematically illustrated in FIG. 4A, vary in response to the acoustic signal impinging on the primary diaphragm 103. The varying capacitances 410, 420 may be processed to produce an output signal representing the acoustic signal. For example, some embodiments include a circuit for producing an output signal in response to inverse changes in the primary capacitance 410 and the reference capacitance 420.

Figure 4B:
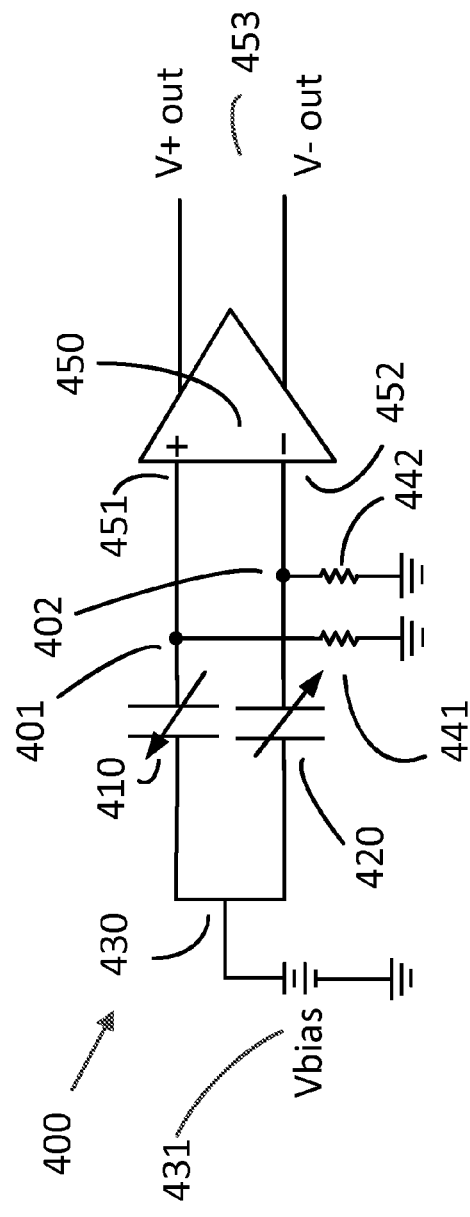
FIG. 4B schematically illustrates a circuit for producing an output signal from inversely variable capacitances.

FIG. 4B schematically shows one embodiment of a circuit 400 for producing an output signal in response to inverse changes in the primary capacitance and the reference capacitance. In circuit 400, the primary diaphragm 103 and the reference diaphragm 203 of a multiple-diaphragm microphone, such as microphone 200 or 300 for example, form an electrical node 430, and are supplied by a common, D.C. bias voltage 431 ("Vbias"). The backplate 103 forms an electrical node 401 with the non-inverting input 451 of differential signal processing circuit 400, for example a differential amplifier 450, and resistor 441. Similarly, the reference electrode 202 forms an electrical node with the inverting input 452 of differential signal processing circuit 450 and resistor 442.

Because the voltage across each of the capacitances 410 and 420 is constant, the varying capacitance in the capacitances 410, 420 creates current flow into and out of the capacitances as those capacitances 410, 420 vary in response to the acoustic signal. More specifically, the current flow into a varying capacitor is described by the following equation: $i = V \, dC/dt$, where "i" is the current flow, "V" is the constant bias voltage, and "dC/dt" is the time variation of the capacitor.

Current flowing from the variable capacitance 410 through the resistor 441 produces a voltage at that node 401, which voltage is coupled to the non-inverting input 451 of the buffer 450. Similarly, current flowing from variable capacitance 420 and through resistor 442 produces a voltage at the node 402, which voltage is coupled to the inverting input 452 of the differential signal processing circuit 450. Together, the voltages at the nodes 401 and 402 form a differential input to the differential signal processing circuit 450. The differential signal processing circuit 450 buffers or amplifies that differential voltage input to produce a differential voltage output ("Vo"=V+out−V−out) at terminals 453. Of course, various embodiments of differential signal processing circuits may produce a single-ended output signals.

In some embodiments, the nominal primary capacitance (410) is equal to the nominal reference capacitance (420). As the capacitances 410, 420 change in response to an impinging acoustic signal, the output voltage signal (Vo) of the circuit 400 as a function of time may be designated as "Vo(t)." Similarly, "dCp" is the change of the primary capacitance (e.g., 410), "dCr" is the change of the reference capacitance (e.g., 420), "Cpn" is the nominal primary capacitance, and "Cm" is the nominal reference capacitance.

In some embodiments, the nominal primary capacitance (Cpn), nominal reference capacitance (Crn), and Vbias are constant, and therefore do not vary with time. In other embodiments, the nominal primary capacitance and nominal reference capacitance may be unequal, or the change in capacitances 410, 420 in response to an impinging acoustic signal (i.e., dCp and dCr) may not be equal. In illustrative embodiments, the output signal (Vo) is proportional to dCp−dCr.

Figure 3:
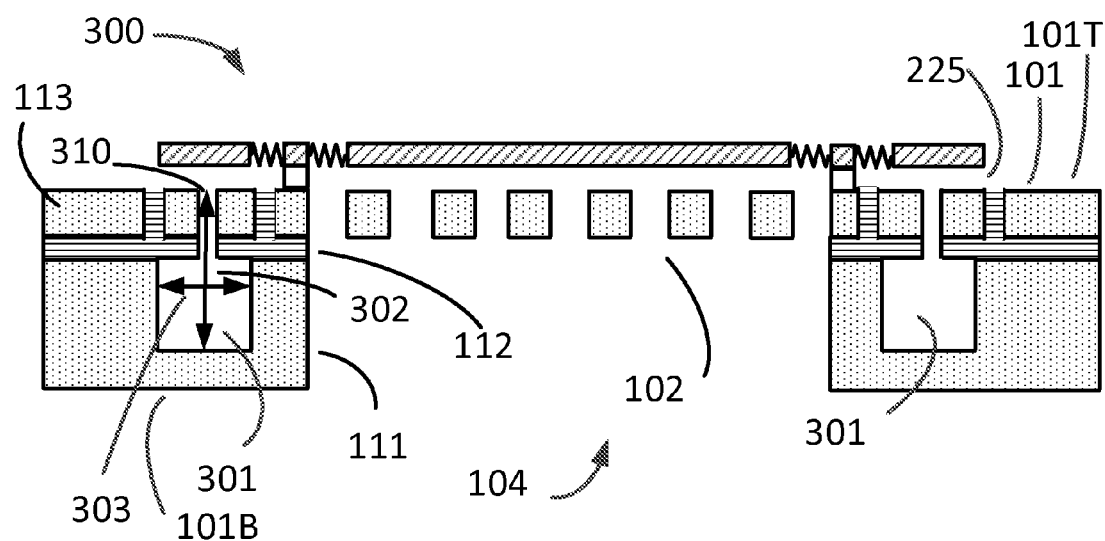
FIG. 3 schematically illustrates an embodiment of a MEMS microphone.

An alternate embodiment of a microphone 300 is schematically illustrated in FIG. 3. The embodiment 300 of FIG. 3 is similar to the microphone 200 of FIG. 2A, but also includes one or more damping relief chambers 301. Some MEMS devices experience a phenomenon known as "squeeze film damping." The phenomenon arises when air or other gas is compressed between a moving MEMS structure and another surface. For example, in some MEMS microphone, squeeze film damping may arise between a moving diaphragm and a substrate.

In the microphone 200, squeeze film damping is not likely to arise between the primary diaphragm 103 and backplate 102 because any rising pressure in the gas between them is likely to be relieved via through holes 107. However, there are no such holes in the substrate 101 beneath the reference diaphragm 203.

In microphone 300, however, damping relief chambers (or "trench") 301 beneath the reference diaphragm 203 provides a volume into which such increasing pressure may be alleviated. In some embodiments, damping relief chambers 301 may be closed-ended; in other words, the chamber 301 is not a throughhole or aperture all the way through the substrate 101 such that an acoustic signal could pass through the substrate and reach the reference diaphragm 203 via the chamber 301. In some embodiments, however, a damping relief chamber 301 may be an aperture passing all the way through the substrate 101, but preferably such an aperture is not exposed to the incoming acoustic signal in such a way as the acoustic signal could pass through the substrate and reach the reference diaphragm 203 via the chamber 301.

In microphone 300, the damping relief chambers 301 have an opening 310 opposite the reference diaphragm 203. In some embodiments, the opening 310 may be through the reference electrode 202, but in other embodiments may be laterally spaced from the reference electrode 202.

The volume of a damping relief chamber 301 should be sufficient to accommodate an inflow of gas as the reference diaphragm 203 moves towards the substrate 101. To that end, the depth 302 of an exemplary damping relief chamber 301 may range from 5 micrometers (5 um) to 500 um, and the width 303 may range between 10 um and 1000 um. In the embodiments of FIG. 3, the depth 302 of the damping relief cavity 301 is less than the thickness of the substrate 101, so that the damping relief cavity 301 is not open to the environment on the side (101B) of the substrate 101 that is opposite to the side (101T) at which the reference diaphragm 203 is located. In some embodiments, as schematically illustrated in FIG. 3, one or more damping relief chambers extend downward from the surface (101T) of the substrate 101 to a depth 302 that is below the buried oxide layer 112 and into the bottom wafer 111 of an SOI wafer. In some embodiments, as schematically illustrated in FIG. 3, one or more damping relief chambers extend downward from the surface (101T) of the substrate 101 to a depth 302 that is at least half the thickness of the substrate 101.

In some embodiments, each a damping relief chamber 301 may be a separate cavity. In other words, the damping relief chambers 301 may not be connected to one another. In other embodiments, however, one or more damping relief chambers 301 may be acoustically connected (other than by being exposed to the same environments beneath the reference diaphragm 203). Some embodiments include a single damping relief chamber 301, for example a single chamber may surround the backplate 102. Such a damping relief chamber 301 may have an annular geometry (i.e., a cross-section of the damping relief chamber 301 forms an annulus in a plane within the substrate, which plane is parallel to the substrate plane) such that it follows an annular reference diaphragm 203.

Figure 5:
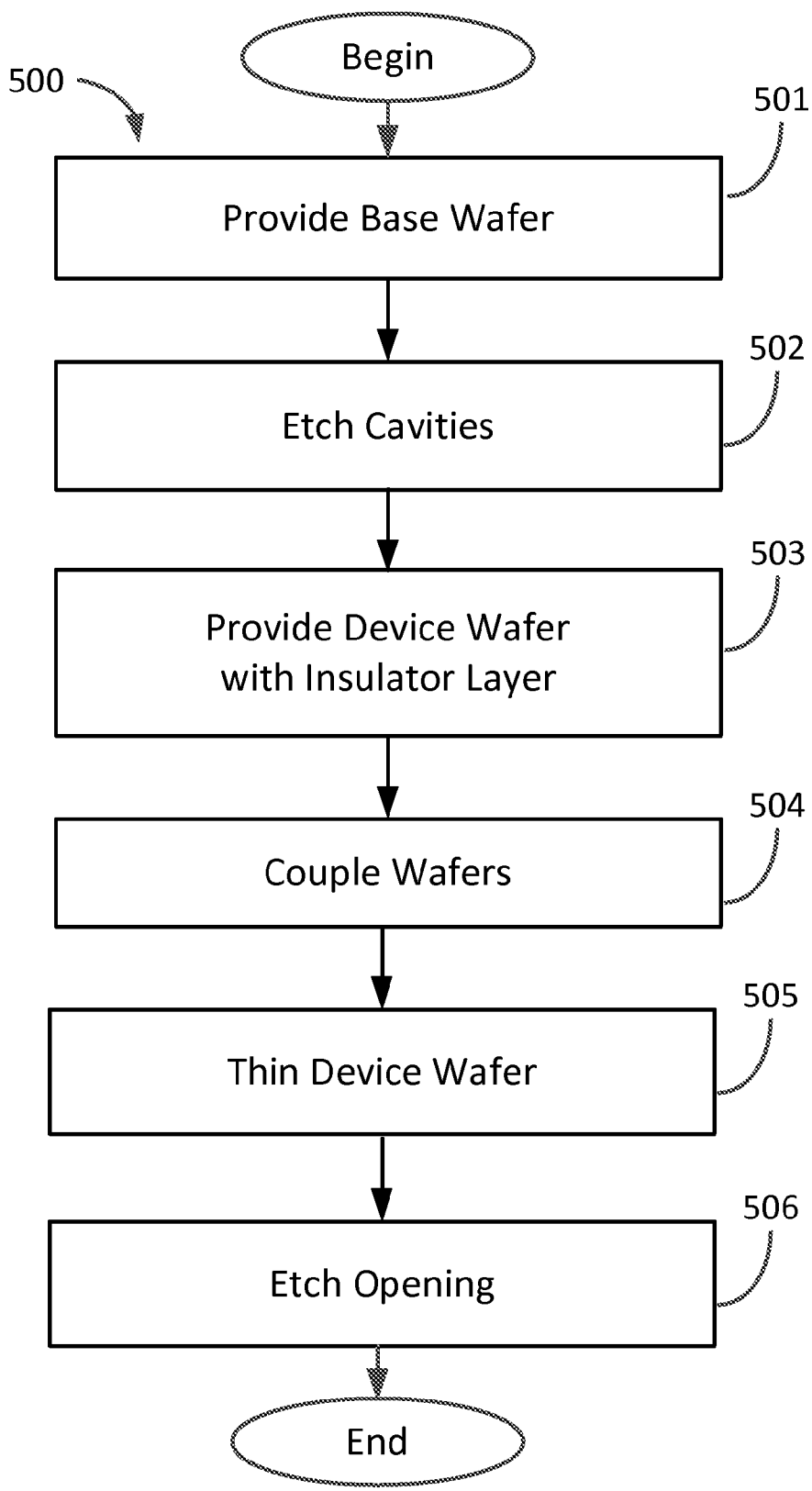
FIG. 5 is a flow chart that illustrates a method of fabricating an embodiment of a substrate for a MEMS microphone.

FIG. 5 is a flow chart illustrating a process 500 of fabricating a MEMS microphone, such as microphone 300 for example, and FIGS. 6A-6E schematically illustrate a substrate of microphone 300 at various stages of fabrication.

The process includes providing a bottom wafer 111 (FIG. 6A) at step 501. Next, one or more trenches 601 are etched into a top surface 151 of the wafer 111, at step 502 (FIG. 6B), according to etching processes known in the art of MEMS fabrication. For example, a mask layer (not shown) may be deposited on surface 151 of wafer 111 everywhere except where the trench 601 is to be etched. An etching material may then be applied to the top surface 151 of the wafer 111, so as to etch the trench 601 into the wafer 111. The mask layer may then be removed.

Next, a top wafer (or device layer wafer) 113 is provided at step 503 (FIG. 6C). The top wafer 113 includes an insulator layer 112, such as an oxide layer for example. If the top wafer does not have an insulator layer 112, then an insulator layer 112 may be deposited on one side 150 of the top wafer 113.

The top wafer 113 is then bonded to the bottom wafer 111 at step 504 (FIG. 6D), such that the insulator layer 112 is sandwiched between the top wafer 113 and bottom wafer 111. As such, the bonded wafers 111, 113 and insulator layer 112 form, in essence, an SOI wafer. If desired, the top wafer 113 may optionally be thinned at step 505 (FIG. 6E). Finally, the trench 601 is opened or exposed by etching an opening 310 through the top wafer 113 and insulator layer 112 at step 506, to form the dampening relief chamber 301. The opening 310 may, for example, be formed during the formation of through-holes 107.

The remaining microphone structures (such as the backplate, reference electrode, primary diaphragm, reference diaphragm, mechanical coupler 210, and connection terminals 110, for example) may be fabricated by processes known in the art. For example, a process for fabricating a MEMS microphone on an SOI wafer is described in U.S. patent application publication number 2009/0202089, the content of which is incorporated herein, in its entirety, by reference. The structure fabricated in that published application does not include a reference diaphragm or a reference electrode, but a reference diaphragm could be fabricated in the same way, from the same materials and layers, and at the same time as that microphone's diaphragm, and a reference electrode may be fabricated using processes known in the art. Such a process would also include fabricating mechanical coupler 210, and could do so in the same way, using the same layers of material, and at the same time as forming that microphone's diaphragm. For example, such a process could form anchors 217, 218 from the insulator layer (212) and form a beam 211 and torsion bar 214 from the same layer of material from which the diaphragm and reference diaphragm or diaphragms are formed.

In another embodiment of the system 700, a MEMS microphone, such as microphones 200 or 300 for example, is secured within a housing 701 having an aperture 704 for receiving acoustic signals. To that end, the housing 701 includes a base 702 and a lid/cover 703 coupled to the base 702. The lid 703 and the base 702 together form a chamber 710 containing the microphone 200. In some embodiments, the lid 703 may be hermetically sealed to the base 702 so that the only acoustic path into the chamber 710 is via an aperture 704, which can extend through the base 702 (e.g., FIG. 7A) or lid 703 (e.g., FIG. 7B). More specifically, in some embodiments, the base 702 includes a base aperture 704 to allow sound (e.g., an acoustic signal) to enter the chamber 710 from a source outside of the housing 701 and impinge on the primary diaphragm 103 of the microphone 200.

Items other than the microphone 200, such as an ASIC 720, may also occupy the chamber 710. The microphone 200 may be electrically coupled to the base 702 in ways known in the art, such as through wirebonds 709 or solder bumps between the microphone 200 and base 702, to name but a few examples.

Figure 7A:
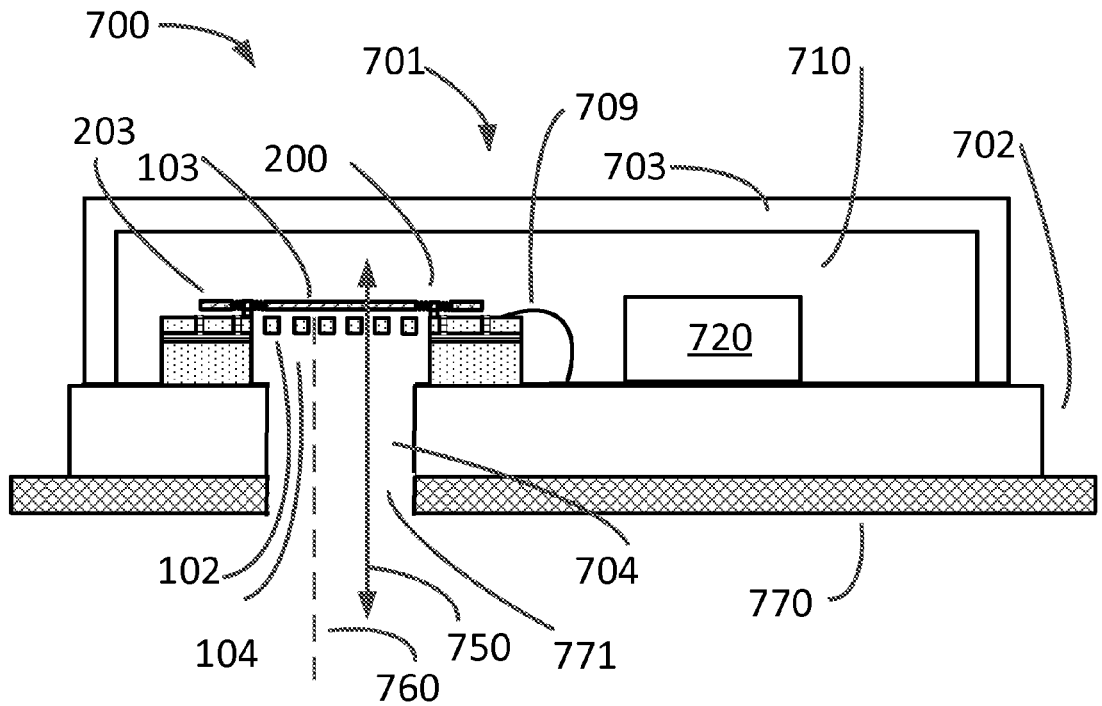
FIG. 7A schematically illustrates an embodiment of a packaged MEMS microphone system.

In the embodiment of FIG. 7A, the microphone 200 is physically coupled to the base 702 such that the backside cavity 104 straddles the aperture base 704. More specifically, the base aperture 704 is aligned with the backside cavity 104 so that an incoming acoustic signal may pass through the aperture 704, enter the backside cavity 104, and ultimately impinge on the primary diaphragm 103.

In some embodiments, a microphone system 700 may be coupled to an underlying substrate 770, such as, a printed circuit board or the housing of a larger assembly (e.g., the body of a cell phone or hearing aid). The substrate 770 may include a corresponding substrate aperture 771 aligned with base aperture 704, to allow an acoustic signal to enter the housing 701 from a source on the opposite side of the substrate 770.

Figure 7B:
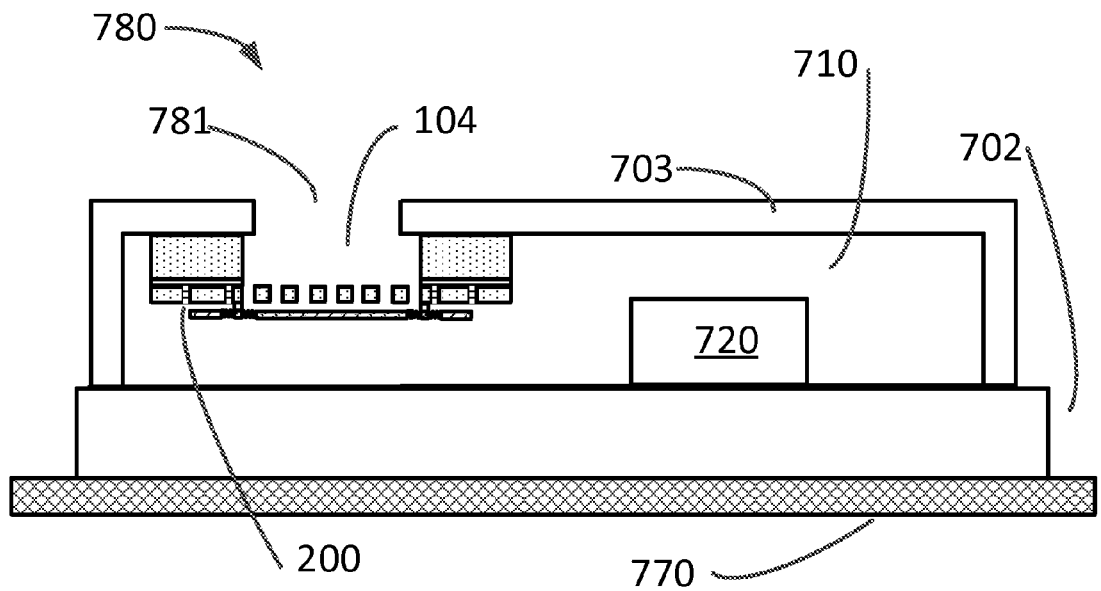
FIG. 7B schematically illustrates an alternate embodiment of a packaged MEMS microphone system.

An alternate embodiment of a packaged microphone system 780 is schematically illustrated in FIG. 7B. In system 780, the lid 703—not the base 702—includes an aperture 781. Microphone 200 is physically coupled to the lid 703 and straddles aperture 781 such that aperture 781 is aligned with the backside cavity 104.

Figure 8A:
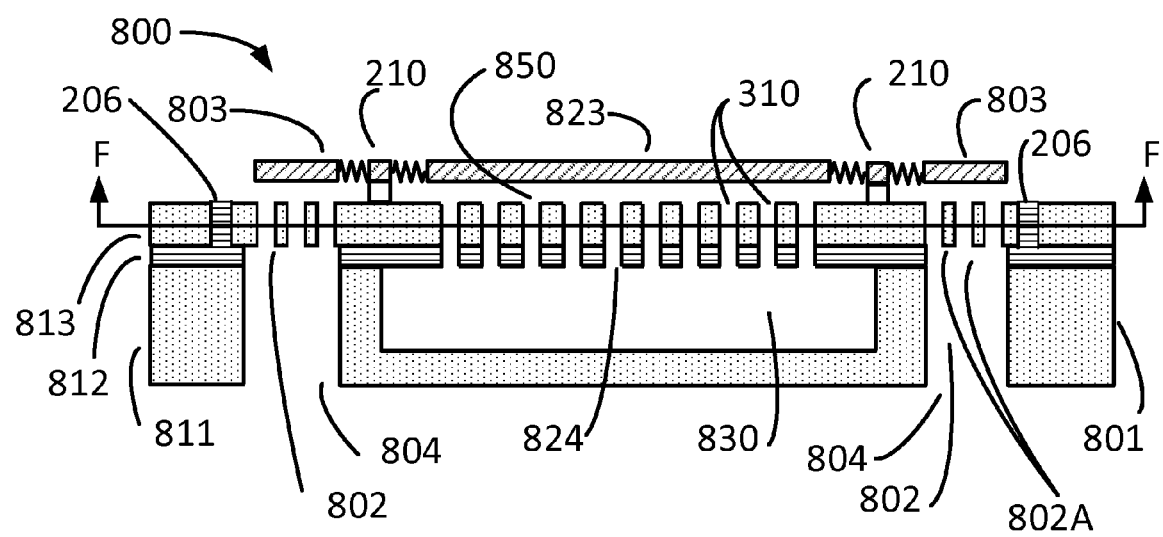
FIGS. 8A-8C schematically illustrate alternate embodiments of two-diaphragm microphones.

In the embodiments illustrated and described above, the center diaphragm has been the primary diaphragm (e.g., 103), and the surrounding diaphragm has been the reference diaphragm (e.g., 203). In other embodiments, however, those roles may be reversed. For example, in one embodiment 800 schematically illustrated in FIG. 8A, shows three layers (811, 812, and 813) of silicon-on-insulator substrate 801. The outer diaphragm (e.g., 803) receives the incoming acoustic signal, and the mechanical couplers 210 transmit the resulting motion to the inner diaphragm 823. As such, the outer diaphragm 803 is the "primary" diaphragm, and the inner diaphragm 823 is the "reference" diaphragm. Indeed, in some embodiments, a primary diaphragm 803 may be annular, and may surround and be concentric with the reference diaphragm 804.

As shown in FIG. 8A, the backside cavity 804 and backplate 802 are below the primary diaphragm 803, and surround a damping relief cavity 830, which is beneath reference diaphragm 823. One or more openings 310 lead from the damping relief cavity 830 to the gap 850 between the substrate 801 and the reference diaphragm 823. Buffer vias 206 electrically isolate the backplate 802 from the remainder of layer 113.

Figure 8B:
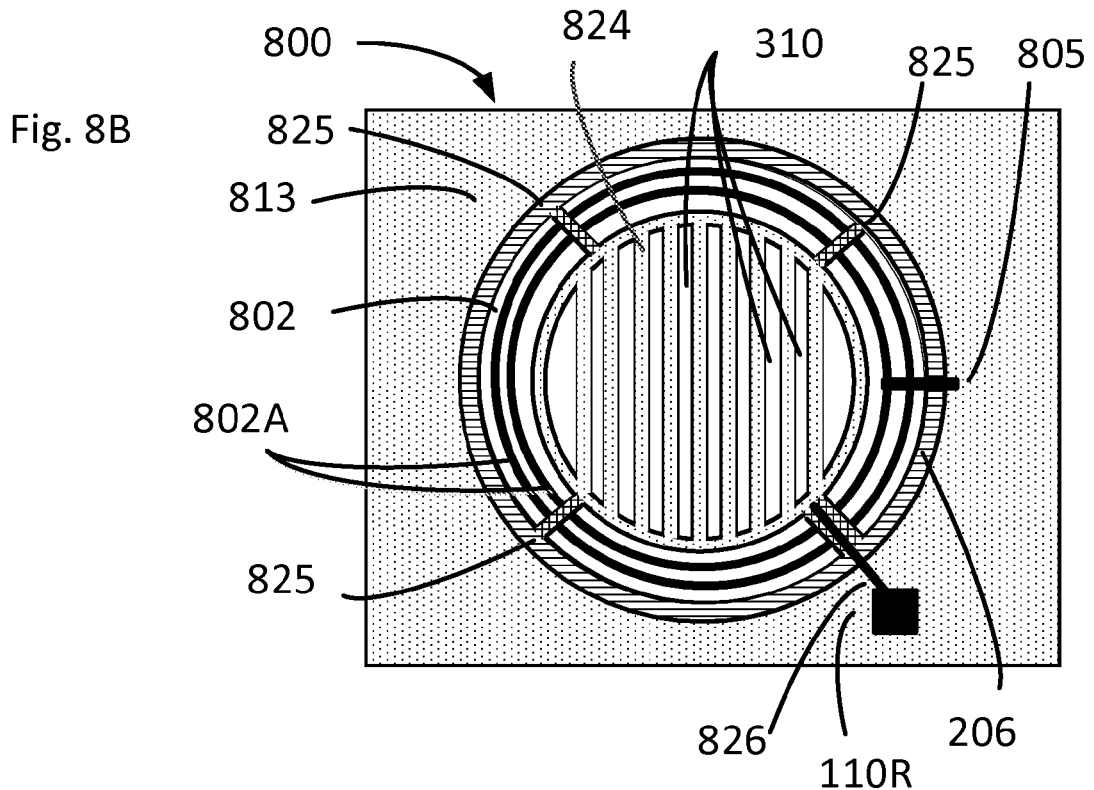

A cross-section of microphone 800 along line F-F is schematically illustrated in FIG. 8B. The cross-section of FIG. 8B is taken through the top layer 813, and so does not show the diaphragms 803, 823, or the mechanical couplers 210.

In this illustrative embodiment, the backplate 802 includes two concentric circular backplate portions or electrodes 802A. Backplate portions 802A are supported by, and electrically coupled to each other by, supporting members 805. The reference electrode 824 and backplate portions 802A are supported by insulative bridges 825. One or more of insulative bridges 825 may also include or carry a conductor 826 to electrically couple reference electrode 824 to an electrical terminal 110R or circuit.

Figure 8C:
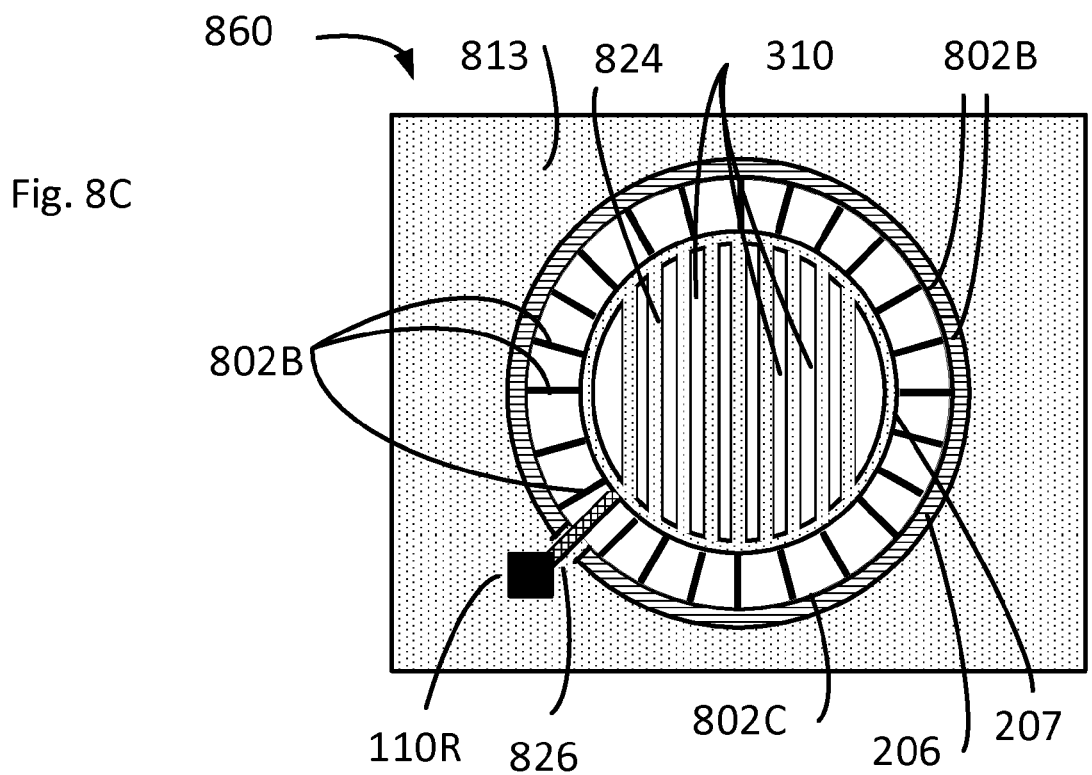

An alternate embodiment 860 is schematically illustrated in FIG. 8C. In that embodiment, the backplate 802 includes several radial electrode segments 802B. Electrode segments 802B are electrically coupled to each other by conductive arc 802C. An insulator ring 207 electrically isolates the reference electrode 824. A connector 826 electrically couples the reference electrode 824 to a terminal 110R.

Figure 9:
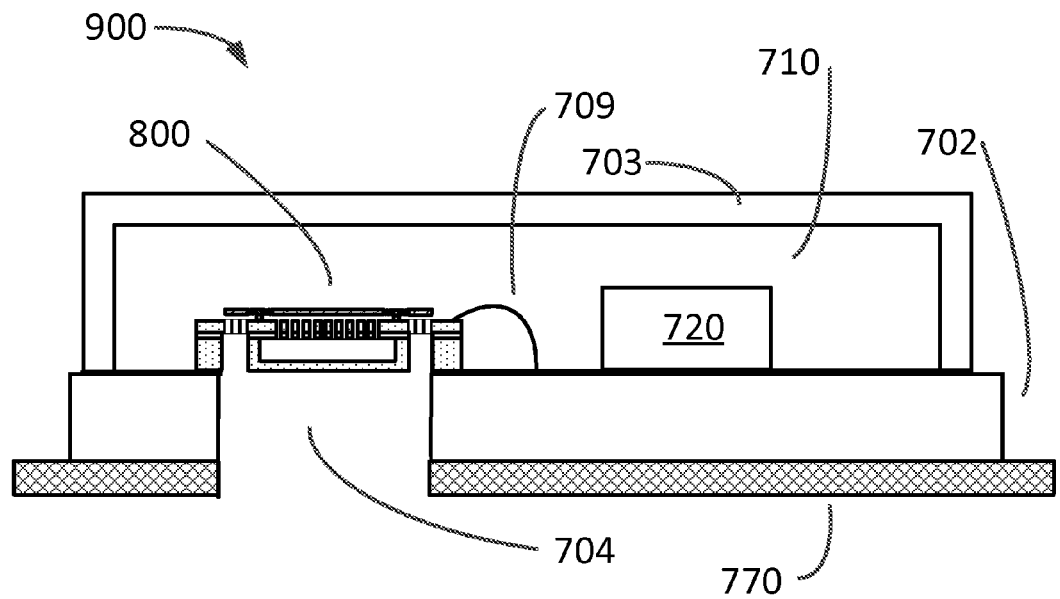
FIG. 9 schematically illustrates an alternate embodiment of a packaged MEMS microphone system.

Another embodiment of a packaged microphone system 900 is schematically illustrated in FIG. 9, and includes a microphone 800 in which the outer diaphragm 803 is the primary diaphragm (e.g. 410), and the inner diaphragm 823 is the reference diaphragm (e.g., 420). In system 900, the substrate 702 includes an aperture 704. Microphone 800 straddles the aperture 704 such that the backside cavity 804 is aligned with the aperture 704. A portion of the substrate 101 remains between the aperture 704 and the reference diaphragm 823, and mitigates the transmission of acoustic energy through aperture 704 to the reference diaphragm 823. In this embodiment, there is no direct acoustic path from the aperture 704 to reference diaphragm 823.

Although illustrative embodiments described above show a backplate (e.g., 102) and reference electrode (e.g., 202) as doped regions of a substrate (e.g., 101), any of the embodiments above may alternately have a conductive material on the substrate (e.g., 101) to form the backplate (e.g., 102) or reference electrode (e.g., 202). For example, FIG. 10 schematically illustrates an alternate embodiment of microphone 200, in which the backplate 102 includes a conductive electrode 102A supported by the substrate 101, and the reference electrode 202 includes a conductive reference electrode 202A supported by the substrate 101. In some embodiments, the substrate 101, or top layer 113 of the substrate 101, may be non-conductive. Indeed, in some embodiments, buffer vias 206 may be omitted.

Definitions. As used in this description and the accompanying claims, the following terms shall have the meanings indicated, unless the context otherwise requires:

The term "aligned" used in reference to two apertures (or in reference to an aperture and a backslide cavity), means that the plan profiles of the apertures (or the aperture and the backside cavity) overlap such that a linearly directed object could pass through both apertures. Two aligned apertures are schematically illustrated in FIGS. 7A-7B, for example. A linearly directed object (double-headed arrow 750) can pass through the two apertures. The term "aligned" used in reference to an aperture (for example 704) and a backslide cavity (for example, 104), means that the aperture (704) and backside cavity (104) are arranged such that a linearly aligned object (750) could pass through the aperture (704) and into the backside cavity (104).

The term "direct acoustic path" means an acoustic path by which an acoustic signal traveling in a straight line (e.g., dashed line 760 in FIG. 7) may pass through an aperture and impinge on a diaphragm without passing through an impeding surface. In a microphone (e.g., 200) with a backplate (e.g., 102), an acoustic signal has a direct acoustic path to a diaphragm (e.g., 103) if the acoustic signal may pass through holes (e.g., 107) from the backside cavity (e.g., 104) to the diaphragm. In some embodiments, the structure and dimensions of a MEMS microphone prohibit a direct acoustic path through the backside cavity to some other feature; for example, an acoustic signal traveling in a straight line cannot propagate through the backside cavity and impinge on the reference diaphragm. In some embodiments, a microphone (e.g., 200) is deployed or installed (e.g., as in a housing 701) such that there is no direct acoustic path from to the reference diaphragm 203. In other words, in such embodiments, if any acoustic energy from an acoustic signal reaches reference diaphragm 203, it may do so only indirectly by, for example, taking a non-straight path between the primary diaphragm 103 and substrate 101, or by passing between the primary diaphragm 103 and mechanical coupler 210 and bending, or reflecting (for example within a chamber 710) to reach the reference diaphragm 203. However, eliminating a direct acoustic path to a reference diaphragm 203 is not a limitation of all embodiments.

The embodiments described above are intended to be merely exemplary; numerous variations and modifications will be apparent to those skilled in the art. All such variations and modifications are intended to be within the scope of the present invention as defined in any appended claims.

What is claimed is:

1. A microphone system for detecting an acoustic signal, the microphone system comprising:
   a micromachined device comprising a backplate;
   a primary diaphragm separated from the backplate by a variable primary gap, the primary diaphragm and the backplate forming a variable primary capacitance across the primary gap, the primary capacitance varying in response to the acoustic signal impinging on the primary diaphragm;
   a reference electrode situated such as to avoid impingement of the acoustic signal;
   a reference diaphragm separated from the reference electrode by a variable reference gap, the reference diaphragm forming a variable reference capacitance with the reference electrode across the variable reference gap; and
   a mechanical coupler coupling the primary diaphragm to the reference, diaphragm,
   the mechanical coupler being configured to vary the reference gap inversely and proportionately to the primary gap, the mechanical coupler also being configured to vary the reference capacitance inversely and proportionately to the primary capacitance.

2. The microphone system of claim 1, wherein the mechanical coupler comprises:
   a torsion bar supported by at least one anchor coupled to a substrate, the torsion bar between the primary diaphragm and the reference diaphragm; and
   a beam coupled to the torsion bar, the primary diaphragm, and the reference diaphragm, the beam mechanically coupling the primary diaphragm to the reference diaphragm.

3. The microphone system of claim 1, wherein the primary capacitance is about equal to the reference capacitance when the microphone is not subject to an acoustic signal.

4. The microphone system of claim 1, wherein the primary diaphragm defines a diaphragm plane when not subject to an acoustic signal, and wherein the reference diaphragm is nominally within the diaphragm plane, and is radially spaced from the primary diaphragm.

5. The microphone system of claim 1, wherein the primary diaphragm and the reference diaphragm define an electrical node.

6. The microphone system of claim 1, wherein the primary diaphragm, the mechanical coupler, and the reference diaphragm define an electrical node.

7. The microphone system of claim 1, further comprising a substrate having a frontside and a backside, the substrate further comprising a backside cavity extending into the backside of the substrate, the primary diaphragm suspended from the frontside and exposed through the backside cavity.

8. The microphone system of claim 1, the system further comprising a differential circuit having a non-inverting input and an inverting input, the primary capacitance electrically coupled to the non-inverting input and the reference capacitance coupled to the inverting input.

9. The microphone system of claim 8, wherein the primary diaphragm is suspended parallel to the backplate, and the reference diaphragm is suspended parallel to the reference electrode.

10. The microphone system of claim 9, wherein the primary capacitance has a nominal primary capacitance value, and the reference capacitance has a nominal reference capacitance value equal to the primary capacitance value.

11. The microphone system of claim 1, further comprising a substrate, the substrate comprising the backplate and the reference diaphragm.

12. The microphone system of claim 11, the substrate further comprising a trough opposite the reference diaphragm.

13. The microphone system of claim 1, wherein the primary diaphragm defines a diaphragm plane, and the reference diaphragm has an annular geometry and surrounds the primary diaphragm within the diaphragm plane.

14. The microphone system of claim 13, wherein the reference diaphragm and the primary diaphragm are concentric.

15. A packaged microphone system for detecting an acoustic signal, the microphone system comprising:
   a housing comprising:
      a base;
      a lid coupled to the base to form a cavity, one of the base and lid forming an aperture extending from the cavity to the environment outside of the housing;
   a MEMS microphone secured within the cavity and being in acoustic communication with the aperture, the MEMS microphone comprising:
      a substrate forming a backside cavity, the substrate being coupled to the base such that the backside cavity covers the aperture;
      a backplate supported by the substrate;
      a primary diaphragm suspended from the substrate and forming a variable primary capacitance with the backplate;
      a reference electrode supported by the substrate electrode and situated such as to avoid impingement of the acoustic signal;
      a reference diaphragm suspended from the substrate and laterally spaced from the primary diaphragm, the reference diaphragm forming a variable reference capacitance with the reference electrode;
      a mechanical coupler coupling the primary diaphragm to the reference diaphragm, the reference diaphragm being configured to move in antiphase to the primary diaphragm when the acoustic signal impinges on the primary diaphragm.

16. The packaged microphone system of claim 15, wherein the reference diaphragm is not directly exposed to the aperture such that there is no direct acoustic path from the base aperture to the reference diaphragm.

17. The packaged microphone system of claim 15, wherein the primary diaphragm and the reference diaphragm are concentric.

18. A microphone system for detecting an acoustic signal, the microphone system comprising:
   a micromachined device comprising a backplate;
   a primary diaphragm suspended parallel to the backplate, and spaced from the backplate by a variable primary gap to form a variable primary capacitance across the primary gap, the primary capacitance varying in response to the acoustic signal impinging on the primary diaphragm;
   a reference electrode situated such as to avoid impingement of the acoustic signal;
   a reference diaphragm suspended parallel to the reference electrode and spaced from the reference electrode by a variable reference gap to form a variable reference capacitance with the reference electrode across the variable reference gap; and
   means for mechanically coupling the primary diaphragm to the reference diaphragm, the mechanically coupling means being configured to vary the reference gap inversely and proportionately to the primary gap in response to impingement of the acoustic signal on the primary diaphragm such that the reference capacitance varies inversely and proportionately to the primary capacitance.

19. The microphone system of claim 18, wherein the means for mechanically coupling comprises:
   means for supporting a torsion bar from a substrate, the torsion bar between the primary diaphragm and the reference diaphragm; and
   a beam coupled to the torsion bar, the primary diaphragm, and the reference diaphragm, wherein the beam mechanically couples the primary diaphragm to the reference diaphragm.

20. The microphone system of claim 19, the system further comprising a circuit for producing an output signal in response to changes in the primary capacitance and the reference capacitance.

21. The microphone system of claim 2, wherein the torsion bar is flexibly attached to the primary diaphragm at one end of the torsion bar and to the reference diaphragm at an opposite end of the torsion bar such that when the primary diaphragm moves in a direction, the reference diaphragm moves in an opposite direction.

22. The microphone system of claim 2 wherein the primary diaphragm is flexible attached to an end of the torsion bar and the reference diaphragm is flexibly attached to a distal end of the torsion bar.

23. The microphone system of claim 22, wherein the primary diaphragm is situated above the backplate and the reference diaphragm is situated above the reference electrode.

* * * * *